United States Patent [19]
Getsinger et al.

[11] 3,934,208
[45] Jan. 20, 1976

[54] LOW NOISE MODULAR PARAMETRIC AMPLIFIER

[75] Inventors: William J. Getsinger, Bethesda; Paul Koskos; Su Min Chou, both of Potomac, all of Md.

[73] Assignee: Communications Satellite Corporation (Comsat), Washington, D.C.

[22] Filed: May 31, 1974

[21] Appl. No.: 475,343

[52] U.S. Cl. ..................... 330/4.5; 330/4.9; 330/53
[51] Int. Cl.² .......................................... H03F 7/04
[58] Field of Search ............................. 330/4.5, 4.9

[56] References Cited
UNITED STATES PATENTS
3,284,717  11/1966  Damiano et al. .................... 330/4.5

Primary Examiner—R. V. Rolinec
Assistant Examiner—Darwin R. Hostetter
Attorney, Agent, or Firm—Sughrue, Rothwell, Mion, Zinn & Macpeak

[57] ABSTRACT

The low noise parametric amplifier disclosed is a non-cryogenic non-redundant plural stage unit with excess gain such that failure of any one stage results in only minor degradation of signal-to-noise ratio. While the amplifier is of general application, it is specifically intended for use in the receiver of an unattended earth terminal of a satellite communication system. In this environment, reliability is achieved by employing a plurality of cascaded, modular parametric amplifier stages. Each stage includes a varactor diode, a pump circuit with its oscillator, a bias circuit, and temperature stabilizing circuitry employing a Peltier junction. The stages are connected to a multi-port circulator by quick disconnect couplings which permit the modular amplifier stages to be removed and replaced without any interruption in the operation of the amplifier.

3 Claims, 5 Drawing Figures

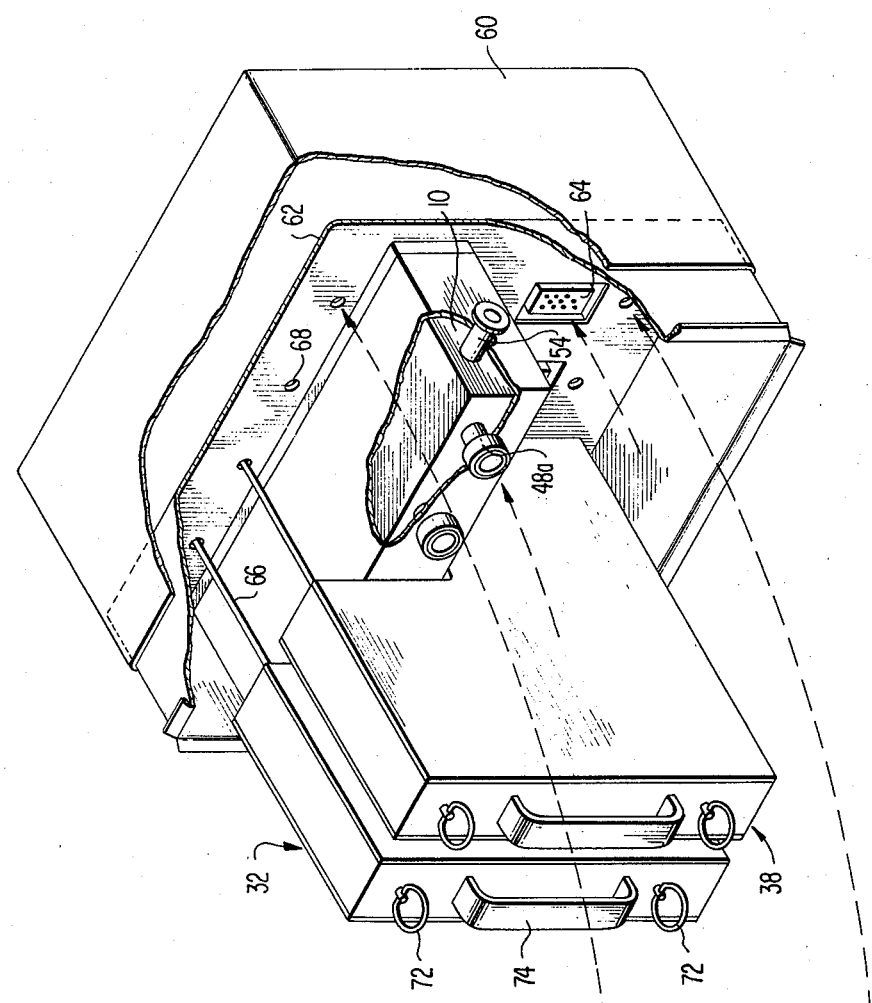

LOW NOISE MODULAR PARAMETRIC AMPLIFIER

BACKGROUND OF THE INVENTION

1. Field of the Invention

The present invention generally relates to microwave amplifiers and, more particularly, to a low noise parametric amplifier of modular construction which achieves a high degree of reliability without resort to parallel redundancy.

2. Description of the Prior Art

Communication satellite earth terminals have evolved from the experimental-operational designs of the early 1960's to the present wideband commercial design requiring considerable on-site manpower. A critical part of these earth terminals is the broadband, low noise receiver connected between the antenna and the down converter or filter-multiplexer for individual channels. Typically, the low noise receiver takes the form of a cryogenic parametric amplifier employing a two-stage refrigerator to provide temperatures on the order of 20°K. Such amplifiers have extremely low noise figures but somewhat marginal reliability figures.

Due to the growing and changing needs of satellite communication systems, it is clear that automatic earth terminals with a high degree of reliability are required to provide economic and quality service in the future. In the low noise receiver of an earth terminal, failure of a cooled stage or of the refrigerator is catastrophic. This failure can be overcome, however, by switching to a redundant receiver unit. Even so, since both units would have been running continuously since the last maintenance, the probability of survival of one of the two is not greatly enhanced. The net result is at best a complicated and expensive receiver requiring a redundant receiver unit, refrigerators, Dewars, switches, and considerable monitoring equipment.

SUMMARY OF THE INVENTION

It is therefore an object of the present invention to provide a low noise parametric amplifier particularly suitable for use as a low noise receiver in an unattended, reliable earth terminal in a satellite communication system.

It is another object of the invention to provide a nonredundant, highly reliable parametric amplifier of unique modular construction which permits removal and replacement of amplifier sections on stages without interruption of service.

It is a further object of the invention to provide a non-cryogenic, low noise parametric amplifier having temperature stabilization circuits wherein failure of any one section or stage results in only a minor degradation of signal-to-noise ratio.

The foregoing and other objects of the invention are attained by providing a plurality of non-cryogenic, modular varactor diode parametric amplifier stages with each stage having its own pump oscillator, temperature stabilizing circuitry, and bias and pump circuit power conditioners. Each modular stage is connected to a circulator port with a quick disconnect coupling. Thus, all the lower reliability, performance-affecting elements, such as the electronics and RF diodes, are in the parametric amplifier modules. If any one of the parametric amplifier modules is removed from the basic chassis or otherwise becomes inoperative, the associated circulator sends the signal to the next stage, thereby resulting in some decrease in gain and some deterioration of the receiver noise temperature. The gain, however, can be recovered by an automatic gain control circuit in the following intermediate frequency section. Thus, neither failure of a parametric amplifier stage nor replacement of an inoperative stage prevents continuous operation of the communication system. Deterioration of the signal-to-noise ratio caused by failure or removal of a parametric amplifier module is greatest for failure of the amplifier stage nearest the antenna, but even then, the reduction in the system signal-to-noise ratio is typically only about 1.5 dB. Failure of both of the first two stages typically results in a signal-to-noise ratio reduction of about 3.2 dB. The invention may, therefore, be characterized as employing a redundant parametric amplifier stage rather than a redundant low noise receiver, and takes advantage of the reflection properties of microwave circulators to eliminate switching thereby resulting in a highly reliable, low cost and simple receiver particularly suited for use in earth terminals of satellite communication systems.

BRIEF DESCRIPTION OF THE DRAWING

FIG. 2 is an exploded perspective view of a specific hardware implementation of the invention.

DETAILED DESCRIPTION OF THE PREFERRED EMBODIMENT

Figure 1:
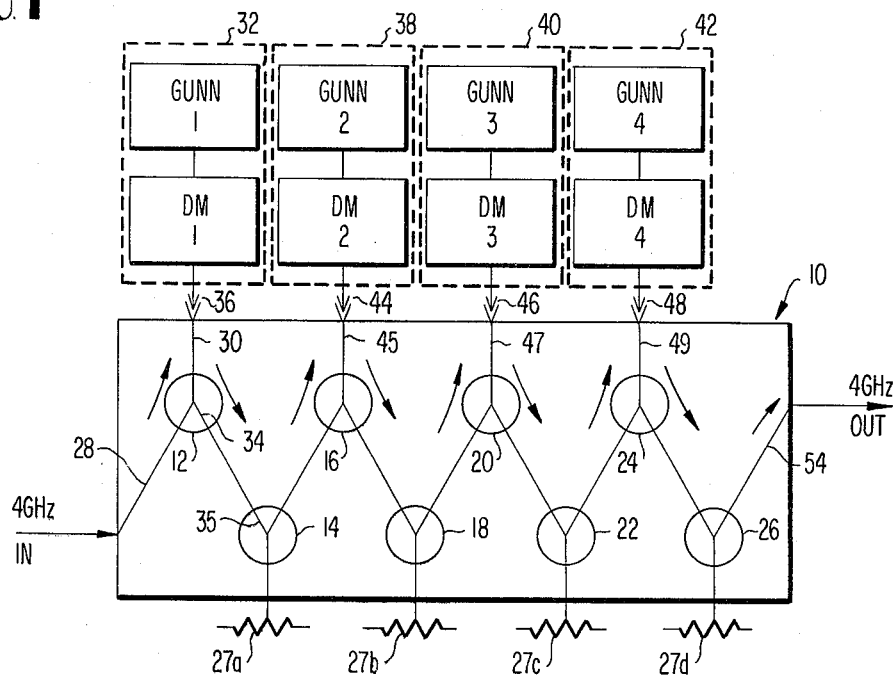
FIG. 1 is a schematic diagram of a low noise parametric amplifier embodying the invention.

FIG. 1 is a schematic diagram illustrating one feature of the invention. A four-stage parametric amplifier is shown as consisting of a strip line circulator 10 having eight circulators labeled 12, 14, 16, 18, 20, 22, 24, and 26. Each circulator is of the three-port, Y-junction type. One port of each of the circulators 14, 18, 22, and 26 is connected to a respective characteristic impedance load 27a, 27b, 27c and 27d, so that these circulators operate as isolators whereby energy is merely transferred from one of the two remaining ports to the other, as indicated in FIG. 1 by the arrows showing the direction of energy or signal flow.

A microwave input signal having a frequency of 4 GHz, for example, is applied to the input port 28 of circulator 12 from where it is transmitted via the port 30 to the first stage parametric amplifier module 32 and then returned through the same port to circulator 12, and thence to the isolator 14 via the ports 34 and 35.

The parametric amplifier module 32 is connected via a quick disconnect coupling 36 to the circulator port 30. Three additional parametric amplifier stage modules 38, 40 and 42 are connected via corresponding quick disconnect couplings 44, 46 and 48 to the corresponding amplifier ports 45, 47 and 49 of the circulators 16, 20 and 24 respectively.

Consequently, four stages of amplification are provided by the low noise parametric amplifier assembly illustrated in FIG. 1. The four parametric amplifier modules are identical and interchangeable, and each provides a gain of 10 db or more. Each amplifier module contains: an unrefrigerated varactor diode subassembly DM 1, 2, 3 or 4; a 100 mw Gunn oscillator pump subassembly GUNN 1, 2, 3 or 4; and the necessary bias circuitry.

In operation, an input signal at port 28 is typically supplied from the antenna of the receiver of an earth terminal, and the low noise parametric amplifier illustrated in FIG. 1 provides a total gain of 40 db ±0.5 db, or 10 db per stage, over a bandwidth of 500MHz to produce a receiver bandwidth of 3.7 to 4.2 GHz.

The output from port 54 of the parametric amplifier is supplied to a down-converter or filter-multiplexer for individual channels. The amplifier is designed with four stages even though the gain provided by only three stages is all that is required. Consequently, if one stage becomes inoperative, sufficient gain is still available. Automatic gain control circuits follow the output port 54 to regulate the gain to the desired value.

However, in the event that one of the parametric amplifier modules 32 becomes inoperative, the overall amplifier fails soft in the sense that the signal through the overall amplifier is not interrupted, instead only the gain of the inoperative stage is removed. Furthermore, as described in more detail below, since each amplifier module, including the Gunn oscillator pump and a varactor diode subassembly, is connected to the strip circulator by means of a quick disconnect connector, the amplifier module can be quickly removed and a new one reinserted, thereby minimizing the time during which the amplifier operates at less than full gain. Furthermore, the Gunn oscillator pump and the varactor diode subassemblies are temperature-stabilized by means of a Peltier element circuit (FIGS. 3 and 5) thereby holding all current values constant.

In the typical prior art parametric amplifier of this type as shown, for example, in U.S. Pat. No. 3,284,717, the varactor diode subassembly is made integral with the strip line circulator and is not easily and quickly disconnectable as in the present invention. Furthermore, the individual stages in the prior art are typically connected to a common oscillator pump. By contrast, in the present invention, each parametric amplifier stage is in the form of an easily removable and quickly disconnectable module, and each module consists of a Gunn oscillator pump subassembly and a varactor diode subassembly.

FIG. 2 is an exploded, partially cutaway perspective view of a preferred embodiment of the invention which is schematically illustrated in FIG. 1. The strip line circulator 10 is mounted in a housing 60 including a mounting panel 62 including four power sockets 64, one for each amplifier module. In FIG. 2, the parametric amplifier modules 32 and 38 are shown mounted in their operating position within the housing 60. Each module is secured to the panel 62 by means of spring-loaded rods 66 and 67 which pass through the module and through openings 68 in the panel 62. The end of each rod contains projections which pass through matching slots in backing plates 70 fixed to the back of the panel opposite each opening. To remove a module, the D rings 71, 72 on the ends of the rods are merely turned 90° to allow the rod to unlock the module, and then the handle 74 is grasped to withdraw the module from the housing 60.

Module 40 is not illustrated in FIG. 2, and module 42 is shown removed from the housing, and the dashed lines show the manner in which the module 42 fits into the housing 60 and connects with the strip circulator 10. More specifically, the quick disconnect coupling 48 shown in FIG. 1 consists of a conventional coaxial coupling 48a of the screw-type, bayonet-type, or press fit-type, for example. Such a coupling assures a secure electrical and mechanical connection between the corresponding ports of the amplifier and circulator. Furthermore, a power plug 74 in each amplifier module mates with the corresponding power socket 64 when the modules are in operating position within the housing 60.

Figure 3:
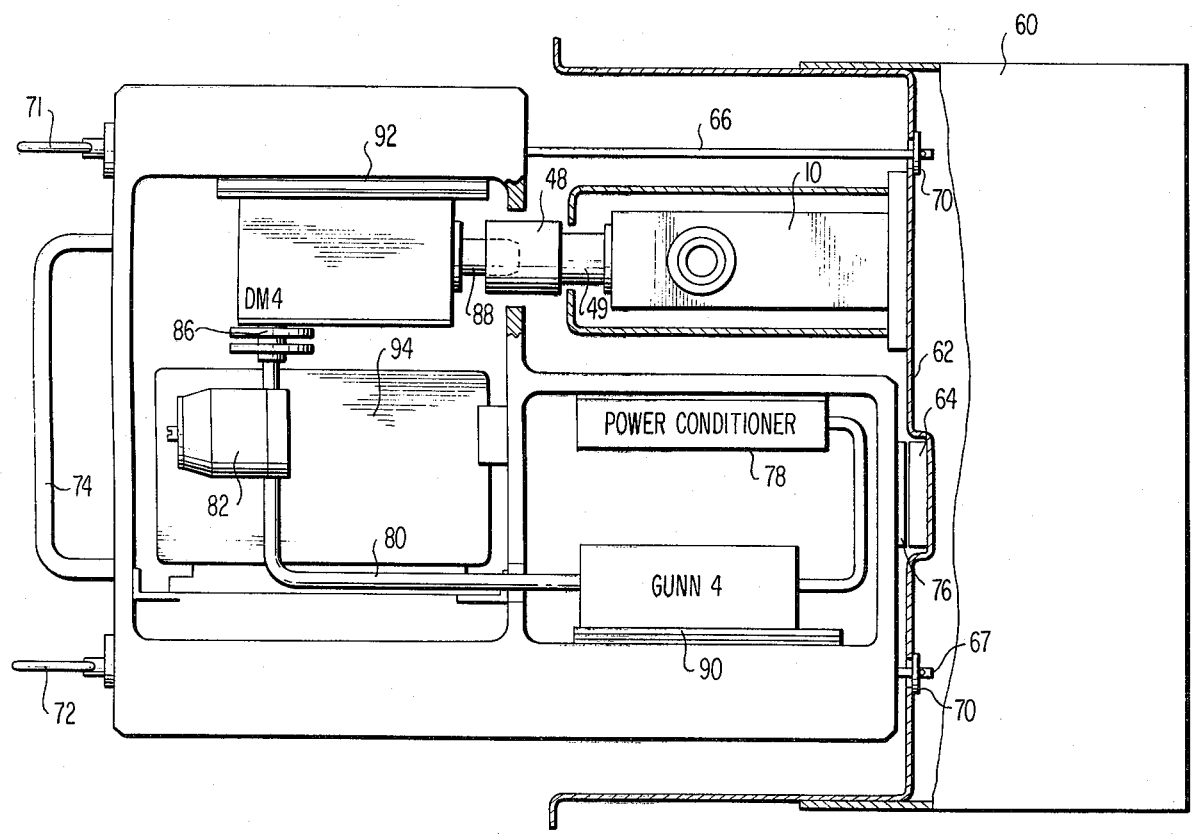
FIG. 3 is a partially cutaway view of the hardware implementation of FIG. 2 and shows the interior components in more detail.

FIG. 3 shows in more detail the interior hardware implementation of each amplifier module. As an example, module 42 is shown as including a conventional power conditioner 78 electrically coupled to the Gunn oscillator pump subassembly GUNN 4 which in turn is coupled via a waveguide 80, a pump attenuator 82, and a waveguide 84 to the input port 86 of the varactor diode subassembly DM4. The output port 88 of DM4 is connected via the coax coupler 48 to the port 49 of the strip line circulator 10. Peltier elements 90 and 92 temperature-stabilize the Gunn oscillator pump and varactor diode subassemblies 90, respectively; and a circuit board 94 controls the Peltier elements.

Figure 4:
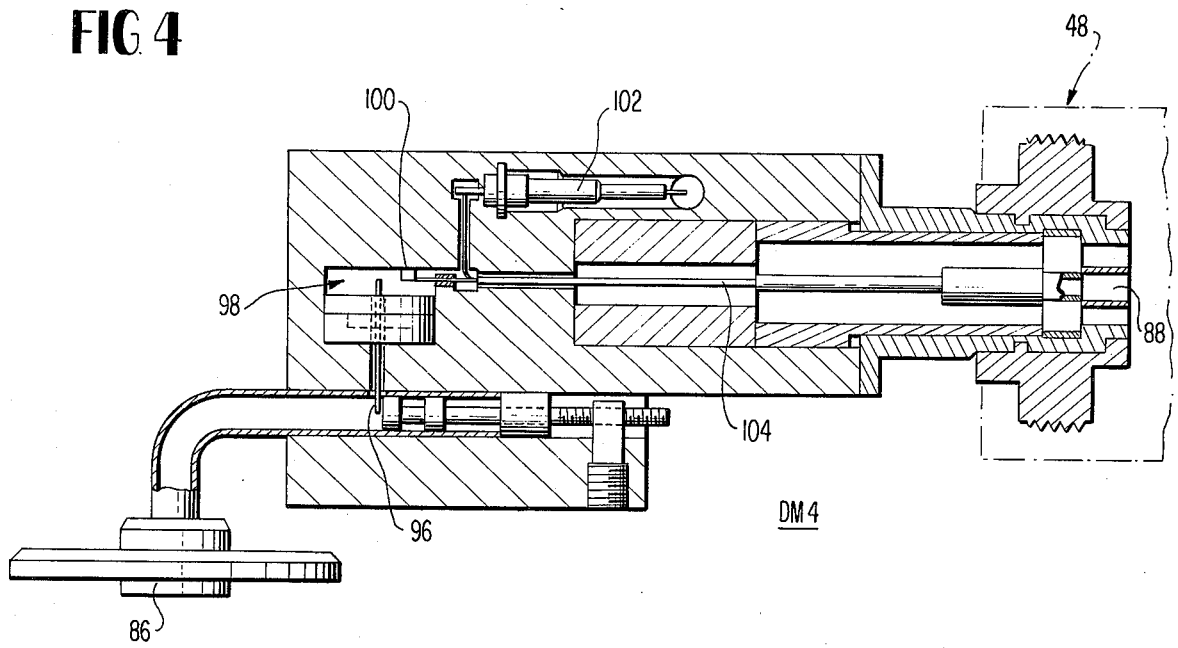
FIG. 4 is a sectional view of the varactor diode module employed in the invention.

FIG. 4 is a sectional view showing the details of a preferred tunable varactor diode subassembly, DM4, for example. The subassembly consists of the waveguide 86 which is adapted to be coupled to the pump attenuator 82. The waveguide is coupled to a coaxial line 96 which is coupled to the varactor diode cavity 98 containing the varactor diode 100 which is biased via a base circuit 102. The diode 100 is connected via a gain and broadbanding coax section 104 to the output port 88 which is connected via the coax coupling 48 to the port 49 of the strip line circulator 10.

Figure 5:
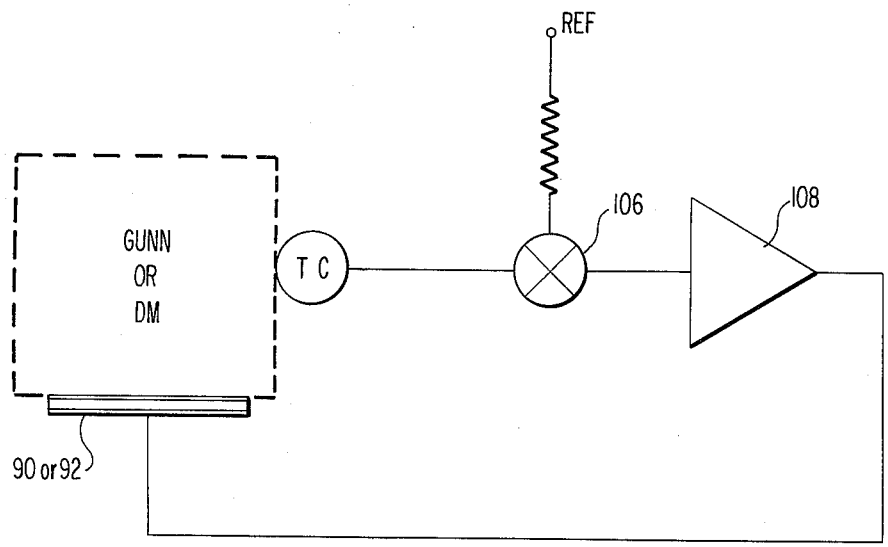
FIG. 5 is a schematic circuit diagram of a Peltier temperature stabilizing circuit used for stabilizing the temperature of the oscillator pump and the varactor diode components of the parametric amplifier module.

FIG. 5 schematically illustrates a conventional temperature-stabilizing circuit for the Peltier elements 90 and 92. A thermocouple or thermistor TC senses the temperature of the Gunn diode pump or varactor diode subassembly and produces a temperature-dependent current which is summed or compared in a summing network 106 with a reference current representing a reference temperature. The algebraic sum is amplified by amplifier 108 and applied to the Peltier element. The direction of current through the Peltier element determines whether the element cools or heats the contiguous subassembly.

The foregoing specification describes a low-noise parametric amplifier unit which is redundant-by-stage, rather than by amplifier unit. Furthermore, each amplifier stage, including an oscillator pump, is constructed as a module which can be quickly and easily removed from the associated strip line circulator, without interrupting the operation of the amplifier unit. Furthermore, tolerable signal-to-noise levels are obtained by using Peltier temperature-stabilizing circuits, and without the need for costly and unreliable cryogenic refrigeration apparatus.

We claim:

1. A modular multi-stage parametric amplifier assembly, including a multi-port strip line circulator assembly having a plurality of series-coupled Y-junction circulators and further comprising a plurality of parametric amplifier modules connected to selected ones of said circulators, whereby failure of an amplifier module does not interrupt operation of the parametric amplifier assembly, and a quick-disconnect coupler between each amplifier module and a corresponding one of said selected circulators.

2. A parametric amplifier assembly as defined in claim 1, wherein each amplifier module comprises an oscillator pump subassembly, a varactor diode subassembly, and stabilizing means for stabilizing the temperatures of both subassemblies.

3. A parametric amplifier as defined in claim 2 wherein said stabilizing means comprises Peltier elements contiguous to said subassemblies, and temperature sensing and control circuit means for controlling the current flowing through said Peltier elements so that the temperature of each subassembly is stabilized at a desired reference value.

* * * * *